(12) United States Patent
van Beek et al.

(10) Patent No.: US 8,606,782 B2
(45) Date of Patent: Dec. 10, 2013

(54) SEGMENTATION DESCRIPTION SCHEME FOR AUDIO-VISUAL CONTENT

(75) Inventors: Petrus J. L. van Beek, Camas, WA (US); Ahmet Mufit Ferman, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 2396 days.

(21) Appl. No.: 10/867,981

(22) Filed: Jun. 14, 2004

(65) Prior Publication Data

US 2005/0154763 A1    Jul. 14, 2005

Related U.S. Application Data

(63) Continuation of application No. 10/058,869, filed on Jan. 28, 2002, now abandoned.

(60) Provisional application No. 60/269,786, filed on Feb. 18, 2001.

(51) Int. Cl.
*G06F 17/30* (2006.01)

(52) U.S. Cl.
USPC .............. 707/736; 379/1.02; 381/58; 700/94; 708/172; 707/916

(58) Field of Classification Search
USPC .............. 379/1.02; 381/58; 700/94; 708/172; 707/736, 916
See application file for complete search history.

(56) References Cited

U.S. PATENT DOCUMENTS

| | | |
|---|---|---|
| 4,183,056 A | 1/1980 | Evans et al. |
| 4,253,108 A | 2/1981 | Engel |
| 4,298,884 A | 11/1981 | Reneau |
| 4,321,635 A | 3/1982 | Tsuyuguchi |
| 4,520,404 A | 5/1985 | von Kohorn |
| 4,729,044 A | 3/1988 | Kiesel |
| 4,937,685 A | 6/1990 | Barker et al. |
| 5,027,400 A | 6/1991 | Baji et al. |
| 5,101,364 A | 3/1992 | Davenport et al. |
| 5,109,482 A | 4/1992 | Bohrman |
| 5,148,154 A | 9/1992 | MacKay et al. |
| 5,200,825 A | 4/1993 | Perine |
| D348,251 S | 6/1994 | Hendricks |
| 5,333,091 A | 7/1994 | Iggulden et al. |

(Continued)

FOREIGN PATENT DOCUMENTS

| | | |
|---|---|---|
| JP | 11-052267 | 2/1999 |
| JP | 11-261908 | 9/1999 |
| JP | 2000-013755 | 1/2000 |
| WO | WO99/65237 | 12/1999 |

OTHER PUBLICATIONS

Qian et al., "Description Schemes for Consumer Video Applications," ISO/IEC JTC1/SC29/WG11-MPEG-7 Proposal, Feb. 1999.*

(Continued)

*Primary Examiner* — Cheyne D Ly
(74) *Attorney, Agent, or Firm* — Chernoff Vilhauer McClung & Stenzel, LLP

(57) ABSTRACT

A segmentation description scheme for video material that includes references to segments of video contained in different programs. The segmentation description scheme may also interact with a presentation device to present the referenced segments to a user contiguously, without first storing the segments respectively referenced from the different programs.

3 Claims, 10 Drawing Sheets

(56) References Cited

U.S. PATENT DOCUMENTS

| | | |
|---|---|---|
| 5,339,393 A | 8/1994 | Duffy et al. |
| D354,059 S | 1/1995 | Hendricks |
| 5,424,770 A | 6/1995 | Schmelzer et al. |
| 5,434,678 A | 7/1995 | Abecassis |
| 5,452,016 A | 9/1995 | Ohara et al. |
| D368,263 S | 3/1996 | Hendricks |
| 5,521,841 A | 5/1996 | Arman et al. |
| 5,559,549 A | 9/1996 | Hendricks et al. |
| 5,589,945 A | 12/1996 | Abecassis |
| 5,600,364 A | 2/1997 | Hendricks et al. |
| 5,600,573 A | 2/1997 | Hendricks et al. |
| 5,610,653 A | 3/1997 | Abecassis |
| 5,634,849 A | 6/1997 | Abecassis |
| 5,635,982 A | 6/1997 | Zhang et al. |
| D381,991 S | 8/1997 | Hendricks |
| 5,654,769 A | 8/1997 | Ohara et al. |
| 5,659,350 A | 8/1997 | Hendricks et al. |
| 5,664,046 A | 9/1997 | Abecassis |
| 5,664,227 A | 9/1997 | Mauldin et al. |
| 5,675,752 A | 10/1997 | Scott et al. |
| 5,682,195 A | 10/1997 | Hendricks et al. |
| 5,684,918 A | 11/1997 | Abecassis |
| 5,696,869 A | 12/1997 | Abecassis |
| 5,710,884 A | 1/1998 | Dedrick |
| 5,717,814 A | 2/1998 | Abecassis |
| 5,724,472 A | 3/1998 | Abecassis |
| 5,734,853 A | 3/1998 | Hendricks et al. |
| 5,761,881 A | 6/1998 | Wall |
| 5,774,357 A | 6/1998 | Hoffberg et al. |
| 5,778,108 A | 7/1998 | Coleman, Jr. |
| 5,797,001 A | 8/1998 | Augenbraun et al. |
| 5,798,785 A | 8/1998 | Hendricks et al. |
| 5,805,733 A | 9/1998 | Wang et al. |
| 5,821,945 A | 10/1998 | Yeo et al. |
| D402,310 S | 12/1998 | Hendricks |
| 5,861,881 A | 1/1999 | Freeman et al. |
| 5,867,386 A | 2/1999 | Hoffberg et al. |
| 5,875,107 A | 2/1999 | Nagai et al. |
| 5,875,108 A | 2/1999 | Hoffberg et al. |
| 5,892,536 A | 4/1999 | Logan et al. |
| 5,900,867 A | 5/1999 | Schindler et al. |
| 5,901,246 A | 5/1999 | Hoffberg et al. |
| 5,903,454 A | 5/1999 | Hoffberg et al. |
| 5,913,013 A | 6/1999 | Abecassis |
| 5,920,300 A | 7/1999 | Yamazaki et al. |
| 5,920,477 A | 7/1999 | Hoffberg |
| 5,923,365 A | 7/1999 | Tamir et al. |
| 5,926,624 A | 7/1999 | Katz et al. |
| 5,933,811 A | 8/1999 | Angles et al. |
| 5,956,026 A | 9/1999 | Ratakonda |
| 5,958,006 A | 9/1999 | Eggleston et al. |
| 5,959,681 A | 9/1999 | Cho |
| 5,959,697 A | 9/1999 | Coleman, Jr. |
| 5,969,755 A | 10/1999 | Courtney |
| 5,973,683 A | 10/1999 | Cragun et al. |
| 5,986,690 A | 11/1999 | Hendricks |
| 5,986,692 A | 11/1999 | Logan et al. |
| 5,987,211 A | 11/1999 | Abecassis |
| 5,990,927 A | 11/1999 | Hendricks et al. |
| 5,990,980 A | 11/1999 | Golin |
| 5,995,095 A | 11/1999 | Ratakonda |
| 6,002,211 A | 12/1999 | Abecassis |
| 6,002,833 A | 12/1999 | Abecassis |
| 6,011,895 A | 1/2000 | Abecassis |
| 6,014,183 A | 1/2000 | Hoang |
| 6,038,367 A | 3/2000 | Abecassis |
| 6,052,554 A | 4/2000 | Hendricks et al. |
| 6,055,018 A | 4/2000 | Swan |
| 6,067,401 A | 5/2000 | Abecassis |
| 6,072,934 A | 6/2000 | Abecassis |
| 6,081,750 A | 6/2000 | Hoffberg et al. |
| 6,088,455 A | 7/2000 | Logan et al. |
| 6,091,886 A | 7/2000 | Abecassis |
| RE36,801 E | 8/2000 | Logan et al. |
| 6,100,941 A | 8/2000 | Dimitrova et al. |
| 6,141,041 A | 10/2000 | Carlbom et al. |
| 6,141,060 A | 10/2000 | Honey et al. |
| 6,144,375 A | 11/2000 | Jain et al. |
| 6,151,444 A | 11/2000 | Abecassis |
| D435,561 S | 12/2000 | Pettigrew et al. |
| 6,160,989 A | 12/2000 | Hendricks et al. |
| 6,161,142 A | 12/2000 | Wolfe et al. |
| 6,169,542 B1 | 1/2001 | Hooks et al. |
| 6,181,335 B1 | 1/2001 | Hendricks et al. |
| 6,195,497 B1 | 2/2001 | Nagasaki et al. |
| 6,201,536 B1 | 3/2001 | Hendricks et al. |
| 6,208,805 B1 | 3/2001 | Abecassis |
| 6,215,526 B1 | 4/2001 | Barton et al. |
| 6,216,129 B1 | 4/2001 | Eldering |
| 6,219,837 B1 | 4/2001 | Yeo et al. |
| 6,230,501 B1 | 5/2001 | Bailey, Sr. et al. |
| 6,233,389 B1 | 5/2001 | Barton et al. |
| 6,236,395 B1 | 5/2001 | Sezan et al. |
| 6,252,544 B1 | 6/2001 | Hoffberg |
| 6,269,216 B1 | 7/2001 | Abecassis |
| 6,275,268 B1 | 8/2001 | Ellis et al. |
| 6,289,165 B1 | 9/2001 | Abecassis |
| 6,304,665 B1 | 10/2001 | Cavallaro et al. |
| 6,304,715 B1 | 10/2001 | Abecassis |
| 6,342,904 B1 | 1/2002 | Vasudevan et al. |
| 6,363,160 B1 | 3/2002 | Bradski et al. |
| 6,418,168 B1 | 7/2002 | Narita |
| 6,490,320 B1 * | 12/2002 | Vetro et al. ............... 375/240.08 |
| 6,549,643 B1 | 4/2003 | Toklu et al. |
| 6,556,767 B2 | 4/2003 | Okayama et al. |
| 6,597,859 B1 | 7/2003 | Leinhart et al. |
| 6,665,423 B1 | 12/2003 | Mehrotra et al. |
| 6,675,158 B1 * | 1/2004 | Rising et al. ....................... 707/2 |
| 6,678,635 B2 | 1/2004 | Tovinkere et al. |
| 6,691,126 B1 | 2/2004 | Syeda-Mahmood |
| 6,724,933 B1 | 4/2004 | Lin et al. |
| 6,741,655 B1 * | 5/2004 | Chang et al. ............. 375/240.26 |
| 6,774,917 B1 | 8/2004 | Foote et al. |
| 6,829,781 B1 | 12/2004 | Bhagavath et al. |
| 6,931,595 B2 | 8/2005 | Pan et al. |
| 6,970,510 B1 | 11/2005 | Wee et al. |
| 6,981,129 B1 | 12/2005 | Boggs et al. |
| 6,993,245 B1 | 1/2006 | Harville |
| 2002/0013943 A1 | 1/2002 | Haberman et al. |
| 2002/0018594 A1 | 2/2002 | Xu et al. |
| 2002/0069218 A1 * | 6/2002 | Sull et al. .................. 707/501.1 |
| 2002/0080162 A1 | 6/2002 | Pan et al. |
| 2002/0083473 A1 | 6/2002 | Agnihotri et al. |
| 2002/0108112 A1 * | 8/2002 | Wallace et al. ................. 725/40 |
| 2002/0120929 A1 | 8/2002 | Schwalb et al. |
| 2002/0141619 A1 | 10/2002 | Standridge et al. |
| 2002/0184220 A1 | 12/2002 | Teraguchi et al. |
| 2002/0194589 A1 | 12/2002 | Cristofalo et al. |
| 2003/0001880 A1 | 1/2003 | Holtz et al. |
| 2003/0026592 A1 | 2/2003 | Kawahara et al. |
| 2003/0081937 A1 | 5/2003 | Li |
| 2003/0177503 A1 * | 9/2003 | Sull et al. ....................... 725/112 |
| 2004/0017389 A1 | 1/2004 | Pan et al. |
| 2004/0088289 A1 | 5/2004 | Xu et al. |
| 2004/0125124 A1 | 7/2004 | Kim et al. |
| 2004/0125877 A1 | 7/2004 | Chang et al. |
| 2004/0227768 A1 | 11/2004 | Bates et al. |

OTHER PUBLICATIONS

Qian et al., Description Schemes for Consumer Video Applications, ISO/IEC JTC1/SC29/WG11-MPEG-7 Proposal, Feb. 1999.*

John S. Boreczky and Lynn D. Wilcox. "A Hidden Markov Model Framework for Video Segmentation Using Audio and Image Features," FX Palo Alto Laboratory, Palo Alto, CA 94304 USA, 4 pages, Date Unknown.

Michael G. Christel, Alexander G. Hauptmann, Adrienne S. Warmack, Scott A. Crosby, "Adjustable Filmstrips and Skims as Abstractions for a Digital Video Library," Computer Science Department, Carnegie Mellon University, Pittsburgh, PA 15213 USA, 7 pages, Date Unknown.

Peng Xu, Shih-Fu Chang, "Algorithms and System for High-Level Structure Analysis and Event Detection in Soccer Video," Cloumbia University, ADVENT—Technical Report #111, Jun. 2001, 11 pages.

(56) References Cited

OTHER PUBLICATIONS

Dennis Yow, Boon-Lock Yeo, Minerva Yeung and Bede Liu, "Analysis and Presentation of Soccer Highlights from Digital Video," Department of Electrical Engineering, Princeton University, Princeton, NJ 08544, to Appear in the Proceedings, Second Asian Conference on Computer Vision (ACCV '95), 5 pages.

Jonathan D. Courtney, "Automatic Video Indexing via Object Motion Analysis," Pattern Recognition, vol. 30, No. 4, pp. 607-625, 1997.

Drew D. Saur, Yap-Peng Tan, Sanjeev R. Kulkarni, and Peter J. Ramadge, "Automated Analysis and Annotation of Basketball Video," SPIE vol. 3022, 1997, pp. 176-187.

Hao Pan, Baoxin Li, and M. Ibrahim Sezan, "Automatic Detection of Replay Segments in Broadcast Sports Programs by Detection of Logos in Scene Transitions," IEEE 2002, pp. IV-3385-IV-3388.

Yihong Gong, Lim Teck Sin, Chua Hock Chuan, Hongjiang Zhang, Masao Sakauchiff,"Automatic Parsing of TV Soccer Programs," IEEE 1995, pp. 167-174.

Yong Rui, Anoop Gupta, and Alex Acero, "Automatically Extracting Highlights for TV Baseball Programs," ACM Multimedia 2000, pp. 105-115.

Nuno Vasconcelos and Andrew Lippman, "Bayesian Modeling of Video Editing and Structure: Semantic Features for Video Summarization and Browsing," IEEE 1998, 5 pages.

Padhraic Smyth, "Belief Networks, Hidden Markov Models, and Markov Random Fields: a Unifying View," To appear in Pattern Recognition Letters, 1998, pp. 1-11.

T. Lambrou, P. Kudumakis, R. Speller, M. Sandler, A. Linney, "Classification of Audio Signals Using Statistical Features on Time and Wavelet Transform Domains," IEEE 1998, pp. 3621-3624.

Rainer Lienhart, Comparison of Automatic Shot Boundary Detection Algorithms, Part of the IS&T/SPIE conference on Storage and Retrieval for Image and Video Databases VII, San Jose, California, Jan. 1999, SPIE vol. 3656, pp. 290-301.

John Canny, "A Computational approach to Edge Detection," IEEE Transactions on Pattern Analysis and Machine Intelligence, vol. PAMI-8, No. 6, Nov. 1986, pp. 679-698.

Richard Qian, Niels Haering, and Ibrahim Sezan, "A computational approach to Semantic Event Detection," IEEE 1999, pp. 200-206.

F. Arman, R. Depommier, A. Hsu, and M-Y. Chiu, "Content-based Browsing of Video Sequences," To appear in the Proceedings of ACM International Conference on Multimedia '94, Oct. 15-20, San Francisco, California, USA, 7 pages.

Hongjiang Zhang, Stephen W. Smoliar and Jian Hua Wu, "Content-Based Video Browsing Tools," SPIE vol. 2417, 1995, pp. 389-398.

Stephen W. Smoliar and Hongjiang Zhang, "Content-Based Video Indexing and Retrieval," IEEE 1994, pp. 62-72.

Stefan Eickeler and Stefan Muller, "Content-Based Video Indexing of TV Broadcast News Using Hidden Markov Models," Proceedings of IEEE International Conference on Acoustics, Speech, and Signal Processing, Phoenix, AZ, 1999, 4 pages.

Zhu Liu and Qian Huang, "Detecting News Reporting Using Audio/visual Information," IEEE 1999, pp. 324-328.

Y. Kawai, et al. "Detection of Replay Scenes in Broadcasted Sports Video by Focusing on Digital Video Effects," IEICE (D-II), vol. J84-D-II, No. 2, pp. 432-435, Feb. 2001 (in Japanese).

Vikrant Kobla, Daniel Dementhon, and David Doermann, Detection of Slow-Motion Replay Sequences for Identifying Sports Videos, Laboratory for Language and Media Processing, University of Maryland, College Park, MD 20742-3275, 1999, pp. 135-140.

H. Pan, P. Van Beek, M.I. Sezan, "Detection of Slow-Motion Replay Segments in Sports Video for Highlights Generation," Proceedings of IEEE International conference on Acoustics, Speech, and Signal Processing, Salt Lake City, UT, 2001, 4 pages.

Minerva Yeung, Boon-Lock Yeo and Bede Liu, "Extracting Story Units from Long Programs for Video Browsing and Navigation," Proceedings of Multimedia '96, 1996 IEEE, pp. 296-305.

Boon-Lock Yeo and Bede Liu, "On the Extraction of DC Sequence from MPEG Compressed Video," IEEE 1995, pp. 260-263.

Frank R. Kschischang, Brendan J. Frey, and Hans-Andrea Loeliger, "Factor Graphs and the Sum-Product Algorithm," IEEE Transactions on Information Theory, vol. 47, No. 2, Feb. 2001, pp. 498-519.

Wayne Wolf, "Hidden Markov Model Parsing of Video Programs," Proceedings of the 1997 IEEE International Conference on Acoustics, Speech, and Signal Processing, pp. 2609-2611.

John S. Boreczky and Lynn D. Wilcox, "A Hidden Markov Model Framework for Video Segmentation Using Audio and Image Features," Proceedings of IEEE International Conference on Acoustics, Speech, and Signal Processing, Seattle, WA, 1998, 4 pages.

Bilge Gunsel, Yue Fu and A Murat Tekalp, "Hierarchical Temporal Video Segmentation and Content Characterization," SPIE vol. 3229, pp. 46-56.

M.R. Naphade et al., "A High-Performance Shot Boundary Detection Algorithm Using Multiple Cues," Proceedings of IEEE International Conference on Image Processing, Chicago, IL 1998, pp. 884-887.

Vikrant Kobla, Daniel Dementhon, and David Doermann, "Identifying sports videos using replay, text, and camera motion features," Laboratory for Language and Media Processing, University of Maryland, college Park, MD 20742-3275, USA, 12 pages.

B. B. Chaudhuri, N. Sarkar, and P. Kundu, "Improved fractal geometry based texture segmentation technique," IEE Proceedings-E, vol. 140, No. 5, Sep. 1993, pp. 233-241.

Toshio Kawashima et al., "Indexing of Baseball Telecast for Content-based Video Retrieval," 1998 IEEE, pp. 871-874.

S. E. Levinson, L. R. Rabiner, and M. M. Sondhi, "An Introduction to the Application of the Theory of Probabilistic Functions of a Markov Process to Automatic Speech Recognition," the Bell System Technical Journal, vol. 62, No. 4, Apr. 1983, pp. 1035-1074.

Dulce Ponceleon, et al., "Key to Effective Video Retrieval: Effective Cataloging and Browsing," 1998 ACM Multimedia, pp. 99-107.

Baoxin Li and M. Ibrahim Sezan, "Event Detection and Summarization in Sports Video," Sharp Laboratories of America, 5750 NW Pacific Rim blvd., Camas, Washington 98607, 5 pages.

Noboru Babaguchi, et al., "Linking Live and Replay Scenes in Broadcasted Sports Video," ACM Multimedia 2000, pp. 205-208.

Giridharan Iyengar and Andrew Lippman, "Models for automatic classification of video sequences," SPIE vol. 3312 1997, pp. 216-227.

Nevenka Dimitrova and Forouzan Golshani, "Motion Recovery for Video Content Classification," ACM Transactions on Information Systems, vol. 13, No. 4, Oct. 1995, pp. 408-439.

Yao Wang, Zhu Liu, and Jin-Cheng Huang, "Multimedia Content Analysis," IEEE Signal Processing Magazine, Nov. 2000, pp. 12-35.

Mark T. Maybury and Andrew E. Merlino, "Multimedia Summaries of Broadcast News," IEEE 1997, pp. 442-449.

Shin'Ichi Satoh and Takeo Kanade, "Name-It: Association of Face and Name in Video," School of Computer Science, Carnegie Mellon University, Pittsburgh, PA 15213, Dec. 20, 1996.

Stuart J. Golin, "New metric to detect wipes and other gradual transitions in video," Part of the IS&T/SPIE Conference on Visual communications and Image Processing '99, Jan. 1999, SPIE vol. 3653, 6 pages.

Ullas Gargi, Rangachar Kasturi, and Susan H. Strayer, Performance Characterization of Video-Shot-Change Detection Methods, IEEE Transactions on Circuits and Systems for Video Technology, vol. 10, No. 1, Feb. 2000, pp. 1-13.

Michael T. Chan, Rockwell Science Center, 1049 Camino Dos Rios, Thousand Oaks, CA 91360 and You Zhang and Thomas S. Huang Department of Electrical and Computer Engineering Coordinated Science Laboratory, and Beckman Institute for Advanced Science and Technology, University of Illinois at Urbana-Champaign, "Real-Time Lip Tracking and Bimodal Continuous Speech Recognition," 6 pages, Date Unknown.

Boon-Lock Yeo and Minerva M. Yeung, "Retrieving and Visualizing Video," Communications of the ACM, Dec. 1997/vol. 40, No. 2, pp. 43-52.

H. B. Lu, Y. J. Zhang, and Y. R. Yao, "Robust Gradual Scene Change Detection," Proceedings of IEEE International Conference on Image Processing, Kobe, Japan, 1999.

Richard J. Qian, M. Ibrahim Sezan, and Kristine E. Matthews, "A Robust Real-Time Face Tracking Algorithm," IEEE 1998, pp. 131-135.

(56) References Cited

OTHER PUBLICATIONS

Lexing Xie, "Segmentation and Event Detection in Soccer Audio," EE 6820 Project, Soccer Audio, Columbia University, May 15, 2001, 9 pages.
Riccardo Leonardi and Pierangelo Migliorati, "Semantic Indexing of Multimedia Documents," IEEE 2002, Apr.-Jun. 2002, pp. 44-51.
R. W. Picard, "A society of models for video and image libraries," IBM Systems Journal, vol. 35, Nos. 3&4, 1996, pp. 292-312.
Alberto Del Bimbo, Enrico Vicario and Daniele Zingoni, "A Spatial Logic for Symbolic Description of Image Contents," Journal of Visual Languages and Computing (1994) 5, pp. 267-286.
B. S. Manjunath and W. Y. Ma, "Texture Features for Browsing and Retrieval of Image Data," IEEE Transactions on Pattern Analysis and Machine Intelligence, vol. 18, No. 8, Aug. 1996, pp. 837-842.
Richard W. Conners and Charles A. Harlow, "A theoretical comparison of Texture Algorithms," IEEE Transactions on Pattern Analysis and Machine Intelligence, vol. PAMI-2, No. 3, May 1980, pp. 204-222.
Noboru Babaguchi, "Towards Abstracting Sports Video by Highlights," IEEE 2000, pp. 1519-1522.
Stephen S. Intille, "Tracking Using a Local Closed-World Assumption: Tracking in the Football Domain," M.I.T. Media Lab Perceptual computing Group Technical Report No. 296, pp. 1-62.
Lawrence R. Rabiner, "A Tutorial on Hidden Markov Models and Selected Applications in Speech Recognition," Proceedings of the IEEE, vol. 77, No. 2, Feb. 1989, pp. 257-286.
Richard O. Duda and Peter E. Hart, "Use of the Hough Transformation to Detect Lines and Curves in Pictures," Communications of the ACM, Jan. 1972, vol. 15, No. 1, pp. 11-15.
Rainer Lienhart, Silvia Pfeiffer, and Wolfgang Effelsberg, "Video Abstracting," Communications of the ACM, Dec. 1997/ vol. 40, No. 12, pp. 55-62.
Michael A. Smith and Takeo Kanade, "Video Skimming for Quick Browsing based on Audio and Image Characterization," School of Computer Science, Carnegie Mellon University, Pittsburgh, PA 15213, Jul. 30, 1995, 22 pages.
Daniel Dementhon, Vikrant Kobla and David Doermann, "Video Summarization by Curve Simplification," ACM Multimedia 1998, pp. 211-218.
Chung-Lin Huang and Chih-Yu Chang, "Video Summarization using Hidden Markov Model," IEEE 2001, pp. 473-477.
Ken Masumitsu and Tomio Echigo, "Video Summarization Using Reinforcement Learning in Eigenspace," IBM Research, Tokyo Research Laboratory, 1623-14, Shimotsuruma, Yamato-shi, Kanagawa, Japan, 4 pages, Date Unknown.
Minerva M. Yeung and Boon-Lock Yeo, "Video visualization for compact Presentation and Fast Browsing of Pictorial Content," IEEE Transactions on Circuits and Systems for Video Technology, vol. 7, No. 5, Oct. 1997, pp. 771-785.
Stephen S. Intille and Aaron F. Bobick, "Visual Tracking Using Closed-Worlds," MIT Media Laboratory Perceptual computing Section Technical Report No. 294, Nov. 1994, pp. 1-18.
Sunghoon Choi, Yongduek Seo, Hyunwoo Kim, and Ki-Sang Hong, "Where are the ball and players?: Soccer Game Analysis with color-based Tracking and Image Mosaick," Dept. of EE, Pohang University of Science and Technology, San 31 Hyoja Dong, Pohang, 790-784, Republic of Korea, pp. 1-15, Date Unknown.
www.pvi.com, at least one year prior to filing.
MPEG-7 Multimedia Description Schemes WD (Version 3.0), ISO/IEC JTC 1/SC 29/WG 11N3411, May 2000, Geneva.
"DDL Working Draft 3.0," ISO/IEC JTC1/SC29/WG11 N3391, MPEG00/May 2000 (Geneva).
"MPEG-7 Multimedia Description Schemes XM (Version 3.0)," ISO/IEC JTC 1/SC 29/WG 11/N3410, May 2000, Geneva.
"MPEG-7 Visual part of eXperimentation Model Version 6.0," ISO/IEC JTC1/SC29/WG11/N3398, Geneva, Jun. 2000.
"Visual Working Draft 3.0," ISO/IEC JTC1/SC29/WG11/N3399, Jun. 2000, Geneva.
Alan E. Bell, "The Dynamic Digital Disk," IEEE Spectrum, Oct. 1999, pp. 28-35.
MPEG-7 Decsription Schemes (V0.5), ISO/IEC JTC1/SC29/WG11/N2844, MPEG 99, Jul. 1999, Vancouver.
"MPEG-7 Media/Meta DSs upgrade (V0.2)," ISO/IEC JTC1/SC29/WG11/MXXXX, MPEG 99, Oct. 1999, Melbourne.
ISO/IEC/JTC1/SC 29N 3966; Mar. 12, 2001, pp. 1-508.
ISO/IEC/JTC1/SC 29N 3705; Nov. 17, 2001, pp. 1-542.
XML Schema, Part 1, Structures, W3C Working Draft, May 6, 1999, pp. 1-37.
XML Schema, Part 2: Datatypes; World Wide Web Consortium Working Draft, May 6, 1999, pp. 1-37.
Millar, et. al.: A Schema for TV-Anytime Segmentation Metadata, AN 195 Contribution from My TV:ES/TN.XTV.KM002, Issue KM0021.C; NDS Systems Division, 2000; pp. 1-27.
Millar, et. al.,: A Schema for TV-Anytime Segmentation Metadata, AN 195r1 My TV Project; ES/TN.XTV.KM002, Issue KM0021.C; NDS Systems Division, 2000, pp. 1-28.

\* cited by examiner

Searching Description Scheme

Navigation Description Scheme

FIG. 2

| Searching/Navigation Description Scheme |
|---|
| Information related to searching |
| Information related to navigation |
|  |
|  |
|  |
|  |

FIG. 3

| Virtual Program |
|---|
| Segment A from program 1 |
| Segment B from program 1 |
| Segment C from program 4 |
| Segment D from program 2 |
| Segment E from program 2 |
| Segment F from program 1 |
| |
| |

FIG. 9

SEGMENTATION DESCRIPTION SCHEME FOR AUDIO-VISUAL CONTENT

CROSS REFERENCE TO RELATED DOCUMENTS

This is a continuation of U.S. patent application Ser. Nos. 10/058,869 filed Jan. 28, 2002, now abandoned which claims the benefit of 60/269,786 filed Feb. 18, 2001 for SEGMENTATION METADATA FOR AUDIO-VISUAL CONTENT.

BACKGROUND OF THE INVENTION

The present invention relates to descriptions of audio-visual material.

Digital audiovisual material is becoming increasingly available to users through digital TV broadcast, digital video cameras, digital video discs, and personal computer based access to multimedia on the Internet or other network. In addition, persistent large-volume storage and non-linear access to audiovisual content is becoming available in consumer devices. Consequently, there is a need for rapid navigation and searching capabilities to enable users to efficiently discover and consume the contents of audiovisual material.

The extensive proliferation of audio-visual material available to users has the potential to overwhelm the consumer and lead to frustration at the inability to search and view content in an efficient manner. Viewing summaries of the content allows the consumer to skip irrelevant content and view the desired content quickly and easily. Further, multiple different summaries, if available, may provide the user with alternative views of a particular program that the user could choose from depending on personal preferences or usage conditions.

Limited summary selection capabilities are appearing more frequently in current technologies, such as the digital video disk (DVD). DVD movies normally provide "scene selections" or "chapter selections" that have a visual array of thumbnails and textual titles associated with each scene. This permits the user to click on the thumbnail of the desired scene, jump to that scene, and start playback. Playback typically continues until the end of the movie, unless the user makes another selection. While somewhat limited, these features provide the capability to index for the purpose of jumping to an arbitrary position and continue playback from that position.

Referring to FIG. 1, a system 10 may be used for the presentation of video, audio, or audiovisual information to a user. The information may be presented to the user using any suitable medium, such as for example, the Internet, a computer network, the radio, a personal computer, and a television. The user or the user's agent interacts with the system 10 to receive the information in a desirable manner and to define preferences as to what type of information is obtained. The term user is intended to refer to the recipient of the information, which may be for example, a person, a machine, or a software program operating on a machine.

To define these interactions, a set of description schemes containing data describing the content of the material may be used. User preferences 12 may be used in several different areas to maximize both the user's enjoyment and the system functionality. The preferences describing the topics and subject matter of interest to the user is used in both searching for and navigating the audiovisual programs 14. These two sets of data, the user preferences 12 and program descriptions 14, are correlated in the filtering and search engine 16 to identify the preferred programs.

The programs identified by the filtering and search engine 16 are then forwarded to a browsing module 18 along with the user's browsing preferences. Another output of the filtering and search engine 16 are preferred programs that the user has designated for storage. These are stored in the storage module 20. The programs selected by the user with the browsing module 18 are then sent to a display 22. The user may utilize multimedia title descriptions of preferred programs to navigate among the programs that the user wants to consume. Once a program is selected, a summary description of that particular program is correlated with user's browsing preferences to offer the user a preferred summary.

The display 22 receives the programs and displays them in accordance with the user's device preferences as to the operation of the display. User's device preferences may include, for example, device settings such as volume setting that may vary with the genre of the program that is being consumed. The display and user's interaction with the display, such as stopping a program before its end and consuming certain types of programs with certain device settings, also provides information in a manner analogous to a feedback loop to update and log the usage history 24. The usage history 24 may be mapped against the preferences by a mapping module 26. This information is then used in conjunction with user inputs by the user preference module 12.

These user preferences may be useful in many contexts, not just an audiovisual presentation system. User preferences and usage history may be transmitted to the provider of audiovisual programs 14 to receive selected programming or directly receive program segments that are preferred by the user. In the latter case, user preferences may be correlated with summary descriptions at the provider side to select and directly deliver summarized audiovisual programs to the user. The preferences may also be transferred to a "smart card" 28 or similar, portable storage and ultimately transferred to another system by the user.

However, it is noted that a framework for the description of the individual description schemes at the user, program, or device level are needed. As illustrated in FIG. 1, the audiovisual programs 14 includes descriptions of the programs in a description framework. The description framework can have several different types of descriptive structures, such as those described in MPEG-7, incorporated by reference herein. Referring to FIG. 2, one particular type of potential description scheme is related to searching. Searching includes information related to the content of the media, such as for example, actors, title, genre, etc. The searching description scheme, as described in MPEG-7, corresponds to a single video as a whole. A different searching description scheme is included for each video. Referring to the entire video is consistent with the desire of the user to quickly search the available videos for particular content related to the videos as a whole. Another type of description scheme is related to navigation. The navigation description scheme includes information related to navigating or otherwise selecting content for viewing, such as for example, table of contents, highlights, key frames, summaries, segments, etc. The navigation description scheme, as described in MPEG-7, corresponds to segments of the video. Referring to segments of the video is consistent with the desire of the user to navigate a particular video in a particular manner.

BRIEF DESCRIPTION OF THE DRAWINGS

FIG. 2 illustrates a searching description scheme and a navigation description scheme.

FIG. 3 illustrates a combined searching and navigation description scheme.

FIG. 9 illustrates a virtual program.

DETAILED DESCRIPTION OF THE PREFERRED EMBODIMENT

The present inventors came to the realization that the previously existing searching description scheme (segment description scheme in MPEG-7) and the navigation description scheme (summary description scheme in MPEG-7), as described in MPEG-7, are inconsistent with one another if it is desirable to navigate portions of a video and simultaneously obtain information regarding the content of those portions. In particular, MPEG-7 does not provide sufficient syntax structures to physically or logically link the segments identified by the navigation description scheme with the video identified by the searching description scheme. Referring to FIG. 3, a modified description scheme syntax incorporates both information related to the searching description scheme and the navigation description scheme (e.g., segmentation description scheme), both within a single description scheme. Moreover, the incorporation of both the searching description scheme and the navigation description scheme into a single description scheme eliminates some redundant information. Within an XML syntax structure both the searching and the navigational descriptions are associated with the same segment definition (e.g., specifies physical location of segment within the video).

Figure 1:
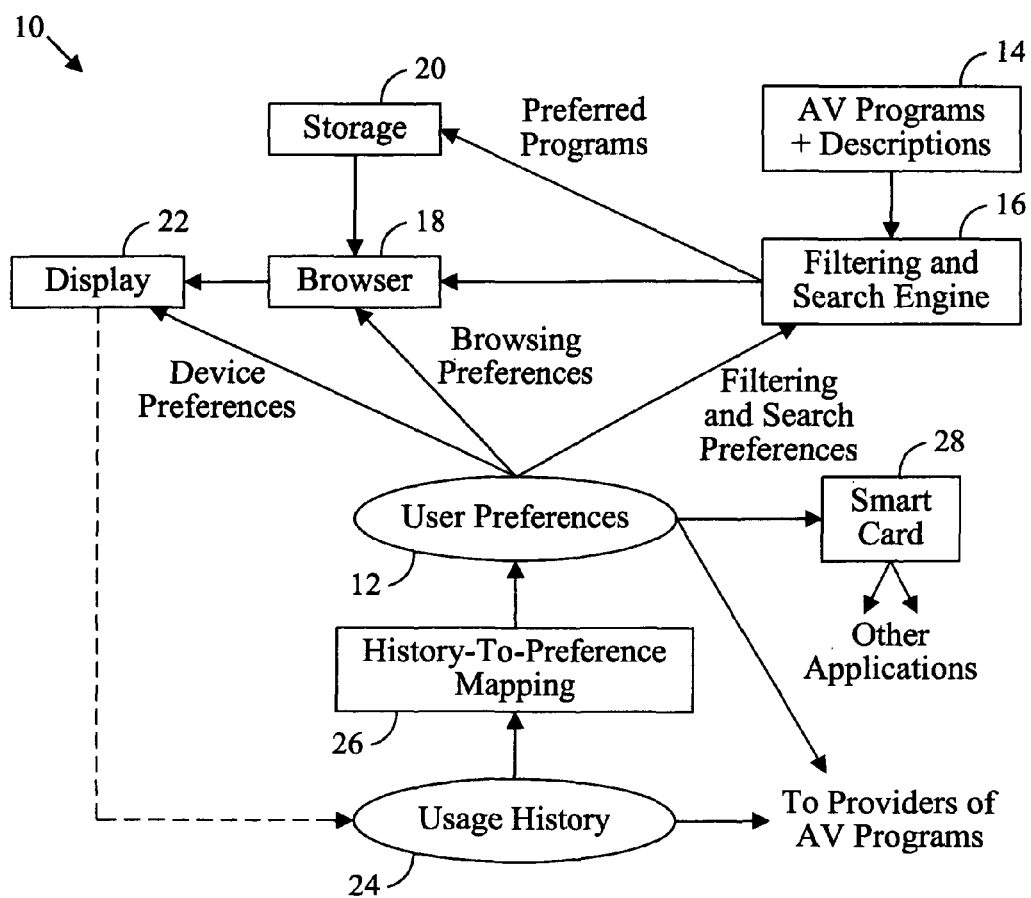
FIG. 1 illustrates a system including preferences.
Figure 4:
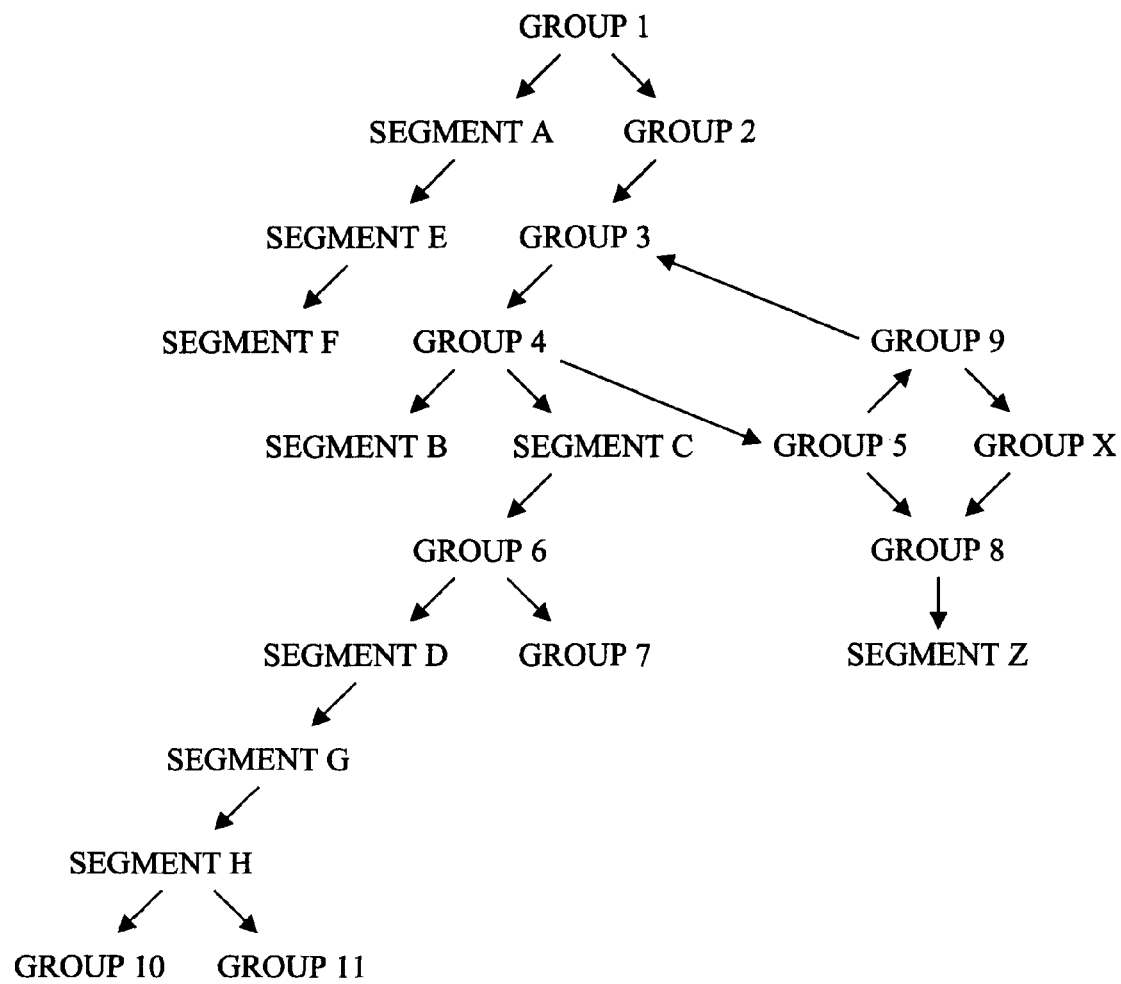
FIG. 4 illustrates a generic hierarchical relationship.

The description scheme structure within MPEG-7 permits a hierarchical nesting structure for segment descriptions of the video and descriptions for groups of segments of the video. The permitted hierarchical nesting structure is very flexible and permits nearly any desirable interrelationship to be defined. Referring to FIG. 4, a sample hierarchical nesting structure is illustrated. While such a hierarchical nesting structure is flexible, it turns out to be extremely difficult determining the order to present the segments of video within such a structure. Within a particular level it is difficult to determine which segments to present first and is further complicated by determining which segment to present within the different hierarchical levels. Moreover, the parsing of such a structure is complex which reduces the computational efficiency of the system.

Figure 5:
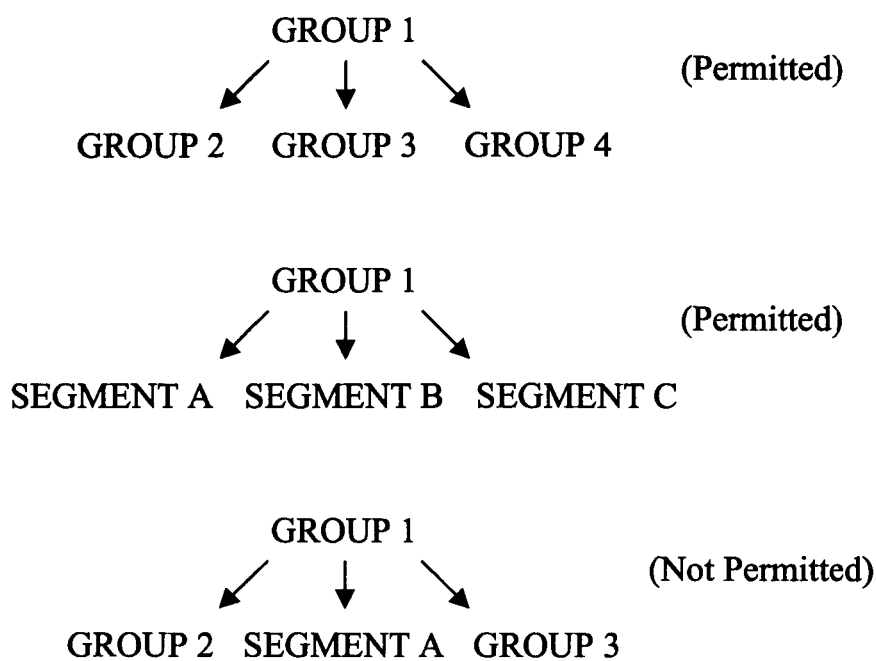
FIG. 5 illustrates permitted grouping.

To overcome the non-deterministic nature of the hierarchical structure the preferred system imposes at least one or more of the following restrictions. A segment group may reference either other segments or other segment groups, but not both, as illustrated in FIG. 5. A segment group references other segments or other segment groups, but does not contain segments itself. In some cases a segment group may reference a single segment or otherwise contain a single segment, in which case it is considered a segment. In this manner, any particular segment group will either reference a set of segments which may be readily ordered, or one or more segment groups. Segments may not reference other segments or segment groups.

Figure 6:
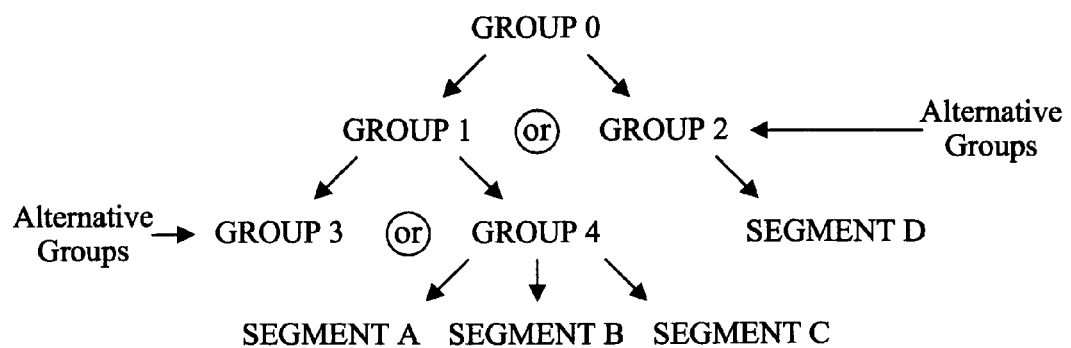
FIG. 6 illustrates alternative groups.
Figure 7:
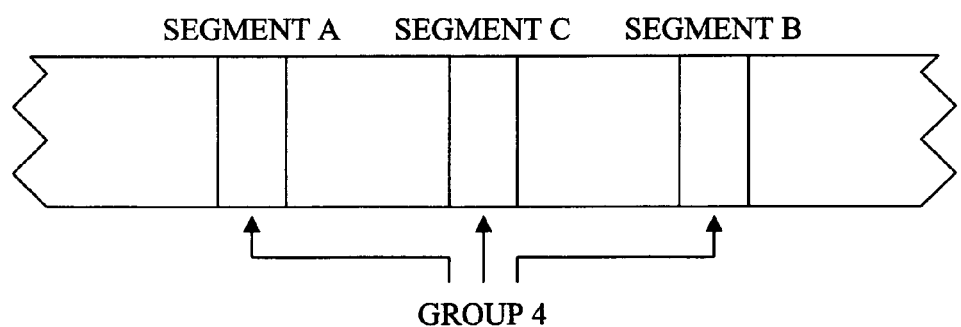
FIG. 7 illustrates a group and related segments.

With the set of permissible interconnections limited a set of rules is useful in order to permit the user to view the available content in an organized manner or otherwise select a set of segments for presentation in a particular order. In this manner the playback, navigation, and presentation order may be unambiguously defined. Therefore different systems will interpret the segmentation data the same. One type of organizational technique is to define segments type "alternativeGroups", which may not contain segments and shall only contain subgroups. The user may select one of the groups from the set of groups at the same hierarchical level originating from the same parent group. Referring to FIG. 6, for example, the user may select Group 1 or Group 2. If Group 1 is selected, then the user may select Group 3 or Group 4. Group 3 consists of one segment. If Group 4 is selected, then the set of segments referenced by Group 4 are made available to the user. If the user selects Group 4 the segments defined within Group 4 may be presented, as illustrated in FIG. 7. The order of presentation of the segments defined by a Group may be presented to the user in an order defined by the order listed within the Group, such as the first in the list is first played or the last in the list is first played.

Figure 8:
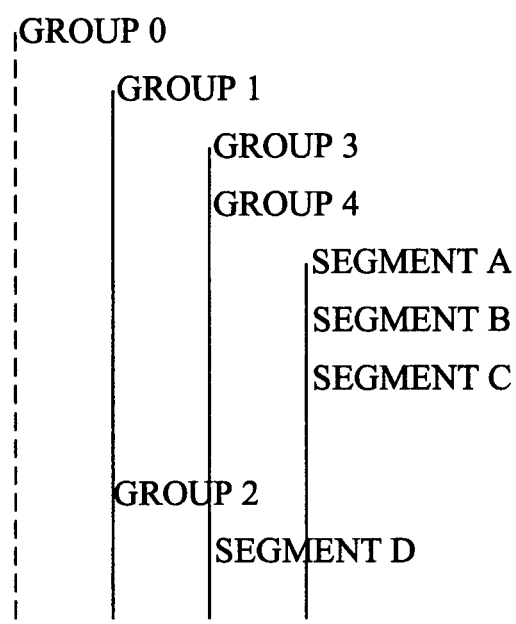
FIG. 8 illustrates a table of contents presentation.

Another type of organizational technique is to define a set of segments of type "tableOfContents", which presents the groups and segments defined therein in an ordered manner such that the hierarchical order may be observed. For example, a portion of the ordered groups shown in FIG. 6 may be organized as a tableOfContents, as shown in FIG. 8. The tableOfContents representation facilitates the user being able to select portions of video content that may be of particular interest to the user in a convenient manner.

Portions of the hierarchical structure of segment groups may be designated as "alternativeGroups" and other portions of the hierarchical structure may be designated as "tableOfContents". Preferably, the two different designations of the hierarchical structure are non-overlapping, but may be overlapping, if desired. These designations are preferably not directly associated with segments.

Existing video summarization systems provide segmentation data for each video and permit the selective viewing of each video according to the segmentation data. While beneficial, the present inventors determined that facilitating the grouping of segments from a plurality of different programs to be viewed within a single presentation defined by a single description scheme is beneficial and not previously possible. A "virtual program" consisting of segments from a plurality of different programs may be dynamically constructed and presented, without the need for physically creating the program on a persistent storage medium. Thus the description scheme syntax may facilitate the identification of the "virtual program" where the relevant segments may be located with multiple different segments of multiple different programs being identified within a single description scheme syntax, as illustrated in FIG. 9. Thus for example, it is possible to view various news reports from different news sources in a sequence without having to individually manually select each news report from each news source.

Principally, existing description schemes for audiovisual content permit linking to external content, such as a web site of a news article on a relevant topic or other material of related interest to the content. However, it was determined that more focused external content may be selected for the user if the content was associated with segments of the video, as opposed to the entire video. In this manner, a single video may include multiple links to external content, each link being associated with a different portion of the video.

Figure 10:
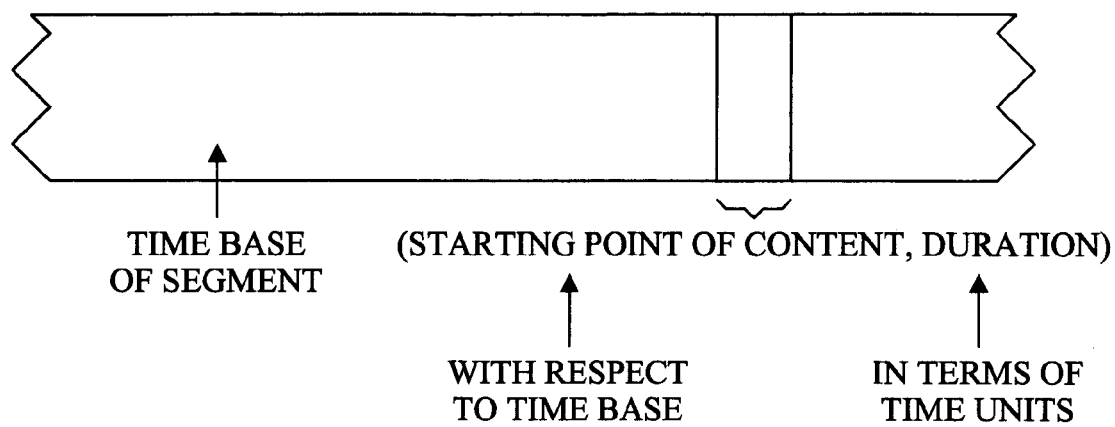
FIG. 10 illustrates a temporal time base for video.

Another issue that arises with respect to selecting segments within multiple different video streams is the different techniques that may be used to indicate "time". For example, the frame rate is not always the same, with movie film typically being 24 frames per second and television being 30 frames per second (each frame consisting of two fields). In addition, the time base for MPEG-1, DVD's, MPEG-2, VCR, Movies, Internet based streaming media, etc., are not the same. Accordingly, the modified description scheme includes a time base indicator of the time base associated with the particular segment, as illustrated in FIG. 10. With the time base defined, either explicitly or implicitly, the beginning of the segment is defined together with an offset indicating the duration of the segment. The offset is in time units, such as seconds, minutes, frames, fields, etc., and may have a default or implicit definition.

The following may be used to describe the descriptive properties of segments:

```
<complexType name="BasicSegmentDescriptionType">
    <sequence>
        <element name="Title" type="mpeg7:TitleType"
            minOccurs="0" maxOccurs="unbounded"/>
        <element name="Synopsis" type="tva:SynopsisType"
            minOccurs="0" maxOccurs="unbounded"/>
        <element name="Keywords" =
            "mpeg7:KeywordAnnotationType"
            minOccurs="0" maxOccurs="1"/>
        <element name="RelatedMaterial"
            type="tva:RelatedMaterialType"
            minOccurs="0" maxOccurs="unbounded"/>
    </sequence>
</complexType>
```

The terms and definitions may be as follows:

| | |
|---|---|
| BasicSegmentDescriptionType | Defines basic segment description. |
| Title | A title of the segment (optional). A segment can have several titles when necessary, e.g. in different languages. |
| Synopsis | A synopsis of textual description of the segment (optional). A segment can have several synopses when necessary, e.g. in different languages or lengths. |
| Keywords | A keyword associated with the segment (optional). A segment can have several keywords when necessary, e.g. in different languages. |
| RelatedMaterial | A link to external material related to the segment (optional). A segment can have multiple links. |

The following element and complex type may be used to define a segment.

```
<element name="Segment Information"
    type="tva:SegmentInformationType"/>
<complexType name="SegmentInformationType">
    <sequence>
        <element name="ProgramRef" type="tva:CRIDRefType"
            minOccurs="0"/>
        <element name="Description"
            type="tva:BasicSegmentDescriptionType"
            minOccurs="0"/>
```

-continued

```
        <element name="SegmentLocator"
            type="mpeg7:MediaTimeType"/>
        <element name="KeyFrameLocator"
            type="mpeg7:MediaTimeType"
            minOccurs="0" maxOccurs="unbounded"/>
    </sequence>
    <attribute name="segmentId" type="xsd:ID"
        use="required"/>
    <attribute name="version" type="xsd:integer"
        use="optional"/>
</complexType>
```

The terms and definitions may be as follows:

| | |
|---|---|
| SegmentInformation | An element that instantiates the SegmentInformationType. |
| SegmentInformationType | Defines an individual segment. |
| ProgramRef | A reference to the program this segment belongs to. When the ProgramRef element is not instantiated within a segment, the program that the segment belongs to is specified by the ProgramRef element of its parent segment group(s). |
| Description | A description of the content of the segment. |
| SegmentLocator | Locates the segment within a program (instance) in terms of start time and duration (optional). Defined as an MPEG-7 datatype, MediaTimeType (See Sec. 6.3.9 of MPEG-7 for a detailed description). If the duration is not specified, the segment ends at the end of the program. If the timeBase and/or timeUnit attributes for the SegmentLocator element are instantiated, they override the default or global time base and time unit definitions provided with the SegmentInformationTable description. |
| KeyFrameLocator | Locates a key frame of the segment within a program in terms of a time point (optional). Defined as an MPEG-7 datatype, MediaTimeType (See Sec. 6.3.9 of MPEG-7 for a detailed description). MediaDuration and MediaIncrDuration elements of a KeyFrameLocator element should not be used. Multiple key frames may be associated with a single segment. If the timeBase and/or timeUnit attributes for the KeyFrameLocator element are instantiated, they override the default or global time base and time unit definitions provided with the SegmentInformationTable description. |
| segmentId | The unique identifier of the segment. |
| version | The version number of the segment information (optional). |

The following element and complex types may be used to define segment grouping.

```
<element name="SegmentGroupInformation"
    type="tva:SegmentGroupInformationType"/>
<complexType name="SegmentGroupInformationType">
    <sequence>
        <element name="ProgramRef" type="tva:CRIDRefType"/>
        <element name="Description"
            type="tva:BasicSegmentDescriptionType"
            minOccurs="0"/>
        <element name="GroupInterval" minOccurs="0">
            <complexType>
                <attribute name="ref" type=xsd:IDREF"/>
            </complexType>
        </element>
        <choice minOccurs="0" maxOccurs="1">
            <element name= "Segments">
                <complexType>
```

```
                <attribute name="refList"
                    type=xsd:IDREFS"use="required"/>
            </complexType>
        </element>
        <element name="Groups"
            <complexType>
                <attribute name="refList"
                    type=xsd:IDREFS" use="required"/>
            </complexType>
        </element>
    <choice>
</sequence>
    <element name="KeyFrameLocator" type="mpeg7:MediaTimeType"
        minOccurs="0" maxOccurs="unbounded"/>
    <attribute name="groupId" type="xsd:ID"
        use="required"/>
    <attribute name="groupType" type="tva:SegmentGroupTypeType"
        use="required"/>
    <attribute name="ordered" type="xsd:boolean"
        use="optional"/>
    <attribute name="numberOfSegments" type="xsd:positiveInteger"
        use="optional"/>
    <attribute name="numberOfKeyFrames" type="xds:positiveInteger"
        use="optional"/>
    <attribute name="numberOfKeyFrames" type="xsd:positiveInteger"
        use="optional"/>
    <attribute name="duration" type="mpeg7:mediaDurationType"
        use="optional"/>
    <attribute name="topLevel" type="xsd:boolean"
        use="optional"/>
    <attribute name="version" type="xsd:integer"
        use="optional"/>
</complexType>
<simpleType name="SegmentGroupTypeType">
    <list>
        <simpleType>
            <restriction base= "xsd:string">
                <enumeration value= "highlights"/>
                <enumeration value="highlights/objects"/>
                <enumeration value="highlights/events"/>
                <enumeration value="bookmarks"/>
                <enumeration value="bookmarks/objects"/>
                <enumeration value="bookmarks/events"/>
                <enumeration value="themeGroup"/>
                <enumeration value="preview"/>
                <enumeration value="preview/title"/>
                <enumeration value="preview/slideshow"/>
                <enumeration value="tableOfContents"/>
                <enumeration value="synopsis"/>
                <enumeration value="shots"/>
                <enumeration value="alternativeGroups"/>
                <enumeration value="other"/>
            </restriction>
        </simpleType>
    </list>
</simpleType>
```

The names and definitions may be as follows:

| | |
|---|---|
| SegmentGroupInformation | An element that instantiates the SegmentGroupInformationType. |
| SegmentGroupInformationType | Defines an individual segment group. |
| ProgramRef | A reference to the program this segment belongs to. When the member segments/groups are collected from different programs (e.g. to create a "virtual program") the ProgramRef element references a group CRID that is resolved into the individual programs CRIDs. |
| Description | A description of the content of the segment group. |
| GroupInterval | References a single segment that defines the temporal range of the segment group. |
| Segments | Defines the segments that are part of this group by providing a list of references to the identifiers of elements of type SegmentInformationType (optional). The order of the references to segments in this list determines the ordering of segments within this group. |
| Groups | Defines the segment groups that are subgroups of this group by providing a list of references to the identifiers of elements of type SegmentGroupInformationType (optional). The order of the references to segment groups in this list determines their ordering within this group. |
| KeyFrameLocator | Locates a key frame of the segment group within a program in terms of a time point (optional). Defined as an MPEG-7 datatype, MediaTimeType (See Sec. 6.3.9 of MPEG-7 for a detailed description). MediaDuration and MediaIncrDuration elements of a KeyFrameLocator element should not be used. Multiple key frames may be associated with a single segment group. |
| groupID | The unique identifier of the segment group. |
| groupType | The type of the segment group. A list of the valid segment group types is defined by SegmentGroupTypeType. |
| ordered | Specifies whether the given segment group presents an ordered list (i.e. whether order of the segment or segment groups within the given segment group is significant) (optional). |
| numberOfSegments | The number of segments in the segment group (optional). The value of this attribute specifies only the segments that are direct members of the segment group. |
| numberOfKeyFrames | The number of key frames in the segment group (optional). The value of this attribute specifies only the key frames of the segments that are direct members of the segment group. |
| duration | The sum of the durations of the segments contained within this group (optional). This duration corresponds to the sum of the durations of the segments that are direct members of the segment group. |
| topLevel | Specifies whether the given segment group is a top-level group (optional). |
| version | The version number of the segment group (optional). |
| SegmentGroupTypeType | A simple type that specifies the valid types of segment groups. |

The allowed types may be defined as follows:

highlights—The group of segments represents selected highlights from one or more programs. The segments that constitute a highlight group are presented seamlessly in sequence, without any temporal interruptions.

highlights/objects—The group of segments represents selected highlights from a program (or programs) that share a common object or objects (e.g. Seinfeld highlights with Kramer).

highlights/events—The group of segments represents selected highlights from a program (or programs) that share a common event or events (e.g. touchdowns in the Super Bowl).

bookmarks—The segment group defines a set of access points to a program. If the member segments of a segment group of type bookmarks contain segment duration information, this duration information shall be ignored, and the segments shall be treated as "open-ended".

bookmarks/objects—The segment group defines a set of access points to a program, where the selected access points share a common object or objects. If the member segments of a segment group of type bookmarks/objects contain segment duration information, this duration information shall be ignored, and the segments shall be treated as "open-ended."

bookmarks/events—The segment group defines a set of access points to a program, where the selected access points share a common event or events. If the member segments of a segment group of type bookmarks/events contain segment duration information, this duration information shall be ignored, and the segments shall be treated as "open-ended.

themeGroup—The segment group comprises segments that share a common topic or theme. The common theme can be specified in the segment group description. A theme group does not necessarily require direct continuous playback.

preview—The segment group defines a preview of a program.

preview/title—The segment group defines a preview of a program, where the preview serves as a promotional title or trailer for the program.

preview/slideshow—The segment group defines a preview of a program, where the preview serves as a compact slideshow of the program content.

tableOfContents—The segment group defines a navigable table of contents for the program.

synopsis—The segment group provides a summary or synopsis of the program.

shots—The segment group provides a list of the shots in the program.

alternativeGroups—Each member of this type of segment group provides an alternative view of representation, with the same functionality but different durations or levels of detail.

other—The functionality of the segment group does not fit into any of the other types defined.

Figure 11:
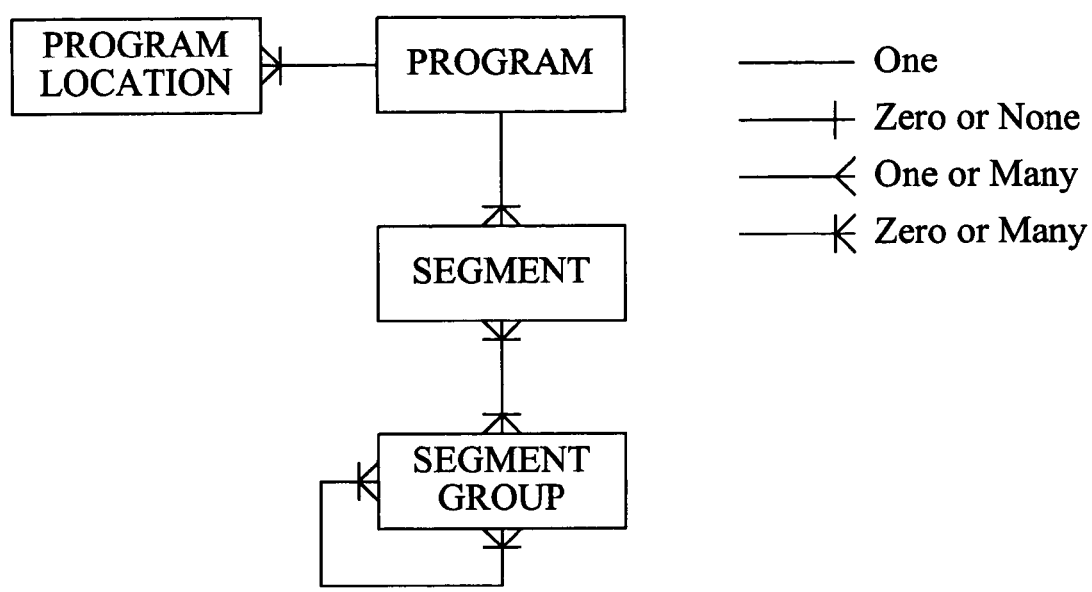
FIG. 11 illustrates entity relationships.

Various validity constraints may be imposed on the proposed description scheme to ensure that (i) it fits the data model of FIG. 11, and (ii) the sequence and relationships of the various segments and segment groups are unambiguously defined. These constraints, which are implicit in the description schemes, are outlined below for clarity:

(a) A segment group may contain either segments, or subgroups, but not both.

(b) A segment group of type "alternativeGroups" may not contain segments and shall only contain subgroups.

(c) A segment group of any type other than "tableOfContents" and "alternativeGroups" may only contain segments. A group of type "tableOfContents" may contain other segment groups of type "tableOfContents".

These validity constraints reduce the complexity of the resulting descriptions by limiting the degree of nesting in the hierarchy. The navigation order of segments or segment groups is determined by the order of references to the segments in a segment group.

The entities may be defined as follows:

| Program | The program entity represents an editorially coherent audiovisual content. |
|---|---|
| Program Location | Program Location provides a physical location where the program is available. A program may be available at multiple program locations; however, the time lines of the different instances of a program are preferably identical. |
| Segment | A segment is a continuous fragment of a program. A particular segment should belong to a single program, but it may be a member of multiple segment groups. |

-continued

| Segment Group | A segment group is a collection of segments that are grouped together, for a particular purpose or due to a shared property. A segment group may contain segments, or other segment groups. |
|---|---|

The entity relationships may be defined, as follows.

| Program-to-Segment | A Segment is part of a single program. A Program may contain multiple segments. |
|---|---|
| Segment-to-Segment Group | A Segment may belong to zero or more Segment Groups. A Segment Group may contain zero or more Segments (possibly from multiple Programs). |
| Segment Group-to-Segment Group | A Segment Group may be a member of zero or more Segment Groups, and it may contain zero or more Segment Groups. A Segment Group may contain either segments, or subgroups, but not both. |

The following element and complex type define a structure for holding segmentation-related metadata.

```
<element name="SegmentInformationTable"
    type="tva:SegmentInformationTableType"/>
<complexType name="SegmentInformationTableType">
    <sequence>
        <element name="SegmentList">
            <complexType>
                <sequence>
                    <element ref="tva:SegmentInformation"
                        minOccurs="0" maxOccurs="unbounded"/>
                </sequence>
            </complexType>
        </element>
<element name="SegmentGroupList">
    <complexType>
        <sequence>
            <element ref="tva:SegmentGroupInformation"
                minOccurs="0" maxOccurs="unbounded"/>
        </sequence>
    </complexType>
</element>
<element name="TimeBase Reference" minOccurs="0"
maxOccurs="unbounded"/>
    <complexType>
        <choice>
            <element name="RefMediaTime" type="mpeg7:
                mediaTimePointType"/>
            <element name="RefURI" type="xsd:anyURI"/>
        </choice>
    </complexType>
</element>
</sequence>
        <attribute name="timeUnit" type="mpeg7:mediaDurationType"
            use="default" value="PT1N1000F"/>
        <attribute name="version" type="xsd:integer" use="optional"/>
</complexType>
```

The names and definitions may be as follows:

| Segment-InformationTable | An element that instantiates the SegmentInformationTableType. |
|---|---|
| SegmentInformation-TableType | Defines a structure for holding segmentation-related metadata. |
| SegmentList | The list of the segments in the SegmentInformationTable |
| SegmentGroupList | The list of the segment groups in the SegmentInformationTable |

| | |
|---|---|
| TimeBaseReference | Defines the time base reference(s) for the current description. Multiple time base references can be specified for a single SegmentInformationTable. These references can be referred to by the timeBase attributes of the SegmentLocator and KeyFrameLocator elements of the description. If no TimeBaseReference is provided in the description, the time base is taken to be the start point of the program identified by the associated CRID. If a single TimeBaseReference element is specified, this element specifies the time base for all the segments in the description. |
| RefMediaTime | Specifies the time base reference using an element of MPEG-7 type mediaTimePointType (See Sec. 6.3.9 of MPEG-7 for a detailed description). |
| RefURI | Specifies the time base reference using an element of type any URI. |
| timeUnit | Specifies the duration of the time intervals used in the incremental specifications of relative time points and duration. Default time unit is milliseconds. |
| version | The version number of the segment information table (optional). |

The terms and expressions employed in the foregoing specification are used therein as terms of description and not of limitation, and there is no intention in the use of such terms and expressions of excluding equivalents of the features shown and described or portions thereof, it being recognized that the scope of the invention is defined and limited only by the claims that follow.

The invention claimed is:

1. An audiovisual device having a processor and a computer-readable storage medium operatively connected to said processor, said storage medium storing a segmentation description scheme in metadata of video presented on said audiovisual device, said video having a plurality of scenes, said segmentation scheme comprising:
   (a) a first segment identifier that identifies a location of a first video segment in a first program capable of presentation on said audiovisual device, where said first video segment is one of a first plurality of video segments of said first program, organized by said metadata into segment groups including at least one AlternativeGroups segment group, and including at least one TableofContents segment group, and including at least one other segment group that is not an AlternativeGroups segment group and is not a TableofContents segment group, each of said segment groups referencing at least one said segment of said first program, and where said metadata organizes said first plurality of video segments into a hierarchically nested relationship defined at least in part by constraints including:
      (i) a segment group is allowed to reference either at least one segment directly or at least one other segment group, but is not allowed to reference both another segment group and a segment directly;
      (ii) an AlternativeGroups segment group is not allowed to reference segments directly and shall only reference other segment groups, where said AlternativeGroups segment group is characterized by providing alternative views or representations of a scene, with the same functionality but either different durations with respect to each other, or different levels of detail with respect to each other;
      (iii) a TableofContents segment group is allowed to reference other TableofContents segment groups, where said TableofContents segment group defines a navigable table of contents for said first program; and
      (iv) a segment group of any type other than AlternativeGroups and TableofContents is allowed to only reference segments directly, and is not allowed to reference other segment groups;
   (b) a second segment identifier that identifies a location of a second video segment in a second program, different from said first program, and capable of presentation on said audiovisual device, where said second video segment is one of a second plurality of video segments of said second program, organized by said metadata into segment groups including at least one AlternativeGroups segment group, and including at least one TableofContents segment group, and including at least one other segment group that is not an AlternativeGroups segment group and is not a TableofContents segment group, each of said segment groups referencing at least one said segment of said second program, and where said metadata organizes said second plurality of video segments into a hierarchically nested relationship defined at least in part by constraints including:
      (i) a segment group is allowed to reference either at least one segment or at least one other segment group, but is not allowed to reference both another segment group and a segment;
      (ii) an AlternativeGroups segment group is not allowed to reference segments and shall only reference other segment groups, where said AlternativeGroups segment group is characterized by providing alternative views or representations of a scene, with the same functionality but either different durations with respect to each other, or different levels of detail with respect to each other;
      (iii) a TableofContents segment group is allowed to reference other TableofContents segment groups, where said segment group defines a navigable table of contents for said second program; and
      (iv) a segment group of any type other than AlternativeGroups and TableofContents is allowed to only reference segments directly, and is not allowed to reference other segment groups; and
   (c) where said processor interacts with said metadata to automatically present said first and second video segments contiguously to a user without storing either of said first video segment and said second video segment prior to presentation.

2. The audiovisual device of claim 1 where said first video segment and said second video segment have different frame rates.

3. The audiovisual device of claim 2 where said first and second segment identifiers each respectively include a first field for storing an indicator of the time base of the respectively identified video segment, a second field for storing a location of the beginning of said respectively identified video segment relative to said time base, and a third field for storing a duration of said respectively identified video segment relative to said time base.

* * * * *